United States Patent

Solis

Patent Number: 5,925,577
Date of Patent: Jul. 20, 1999

[54] METHOD FOR FORMING VIA CONTACT HOLE IN A SEMICONDUCTOR DEVICE

[75] Inventor: Ramiro Solis, Bandera, Tex.

[73] Assignee: Vlsi Technology, Inc., San Jose, Calif.

[21] Appl. No.: 08/943,891

[22] Filed: Oct. 3, 1997

Related U.S. Application Data

[63] Continuation-in-part of application No. 08/803,180, Feb. 19, 1997, Pat. No. 5,851,302.

[51] Int. Cl.$^6$ .................................................. H01L 21/302
[52] U.S. Cl. ........................... 438/725; 438/704; 438/963; 438/637; 438/639; 438/669; 438/720; 134/1.1; 134/1.2; 134/1.3; 216/17
[58] Field of Search ..................................... 438/725, 704, 438/963, 637, 639, 669, 720; 134/1.1, 1.2, 1.3; 216/17

[56] References Cited

U.S. PATENT DOCUMENTS

| | | |
|---|---|---|
| 4,123,841 | 11/1978 | Yano et al. . |
| 4,514,254 | 4/1985 | Klepner . |
| 4,670,091 | 6/1987 | Thomas et al. . |
| 4,983,254 | 1/1991 | Fujimura et al. ........................ 156/643 |
| 5,077,598 | 12/1991 | Bartelink . |
| 5,122,225 | 6/1992 | Douglas ................................... 156/643 |
| 5,348,619 | 9/1994 | Bohannon et al. ...................... 156/664 |
| 5,358,602 | 10/1994 | Sutcliffe et al. . |
| 5,451,291 | 9/1995 | Park et al. . |
| 5,485,304 | 1/1996 | Kaeriyama . |
| 5,497,262 | 3/1996 | Kaeriyama . |
| 5,512,507 | 4/1996 | Yang et al. . |
| 5,521,104 | 5/1996 | Walker . |
| 5,526,951 | 6/1996 | Bailey et al. . |
| 5,573,971 | 11/1996 | Cleeves . |

*Primary Examiner*—Richard A. Booth
*Assistant Examiner*—David A. Zarneke
*Attorney, Agent, or Firm*—Burns, Doane, Swecker & Mathis LLP

[57] ABSTRACT

A method of plasma etching photoresist and sidewall polymer with an etch gas mixture comprising a fluorine containing gas ($CF_4$ or $NF_3$) and $H_2O$ demonstrating very aggressive ashrate of photoresist but maintains an exceptionally low etch rate for titanium nitride and other metals is provided. The very low TiN etch rate permits the inventive method to effectively breakdown sidewall polymer without removing any significant amount of these metals. The invention is particularly suited for stripping sidewall polymer from etched via holes and from etched metal lines. Vias fabricated with this technique exhibit exceptionally low resistance.

11 Claims, 7 Drawing Sheets

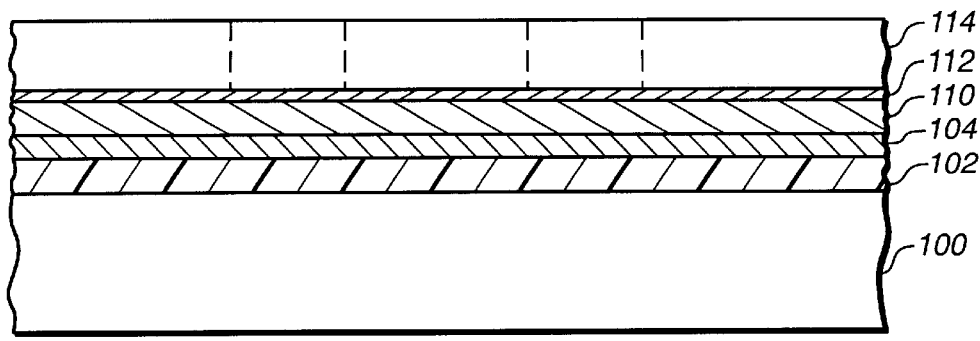
FIG._1A
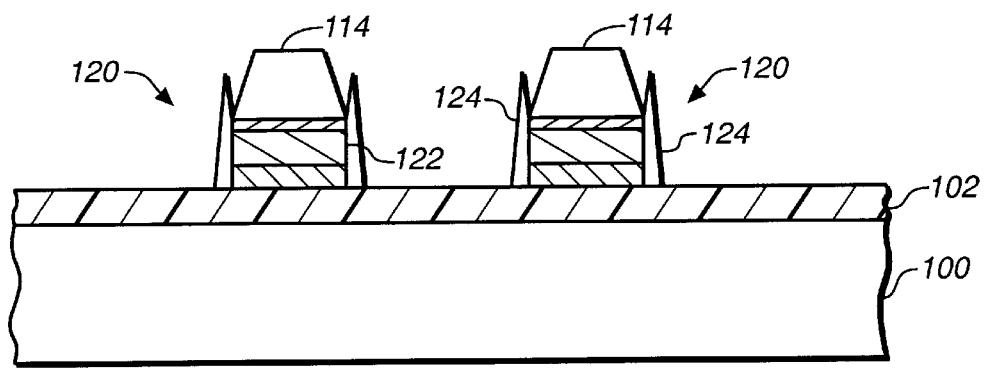
FIG._1B
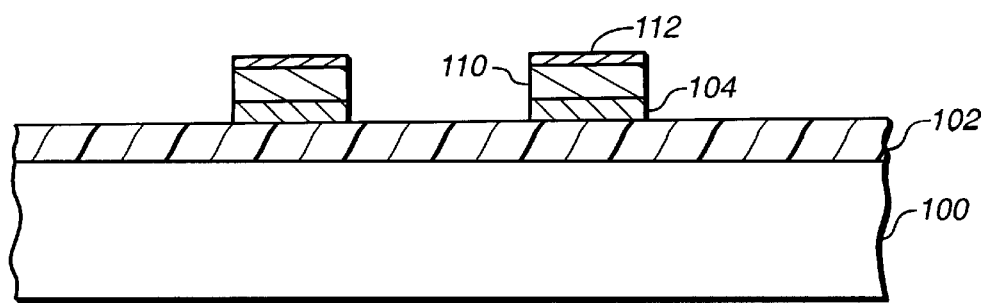
FIG._1C

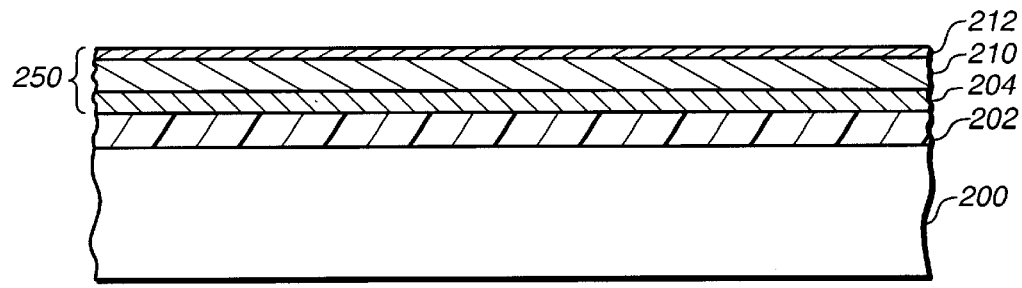
FIG._2A
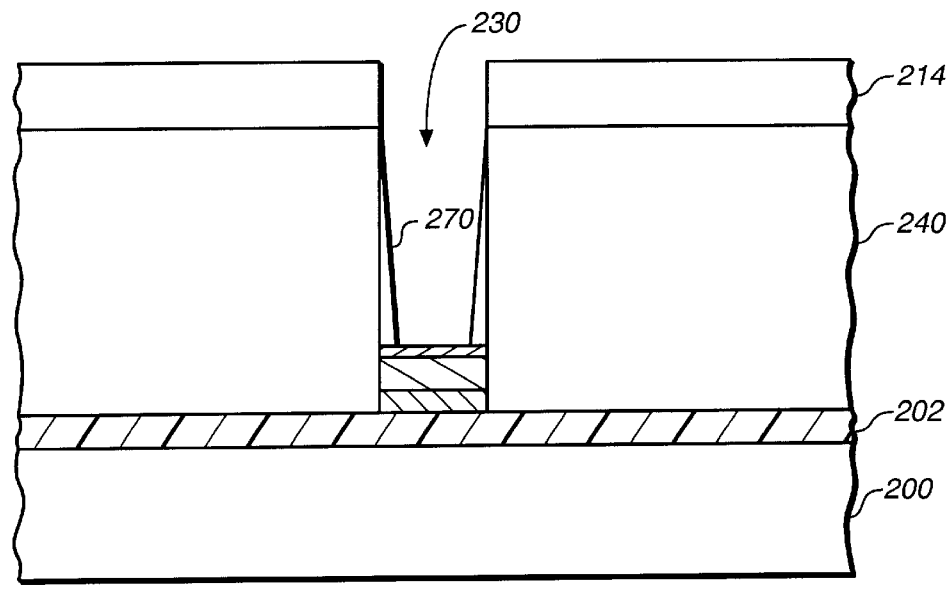
FIG._2B
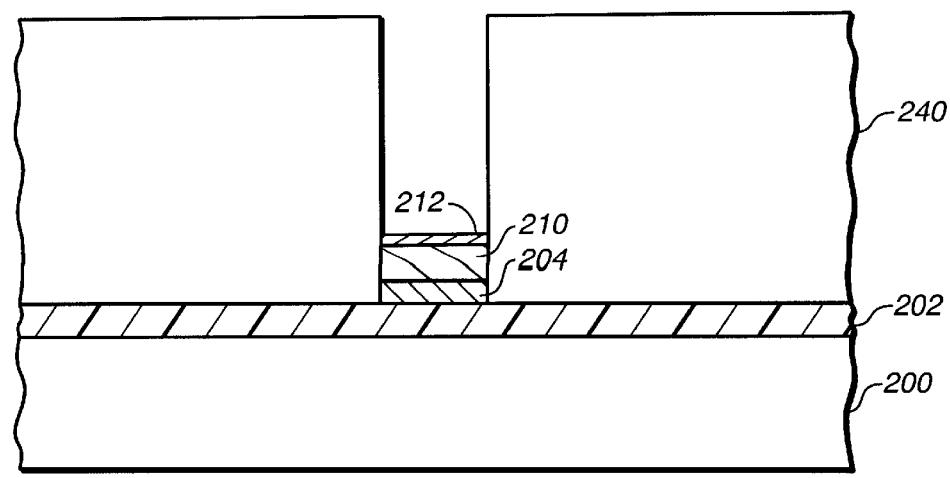
FIG._2C

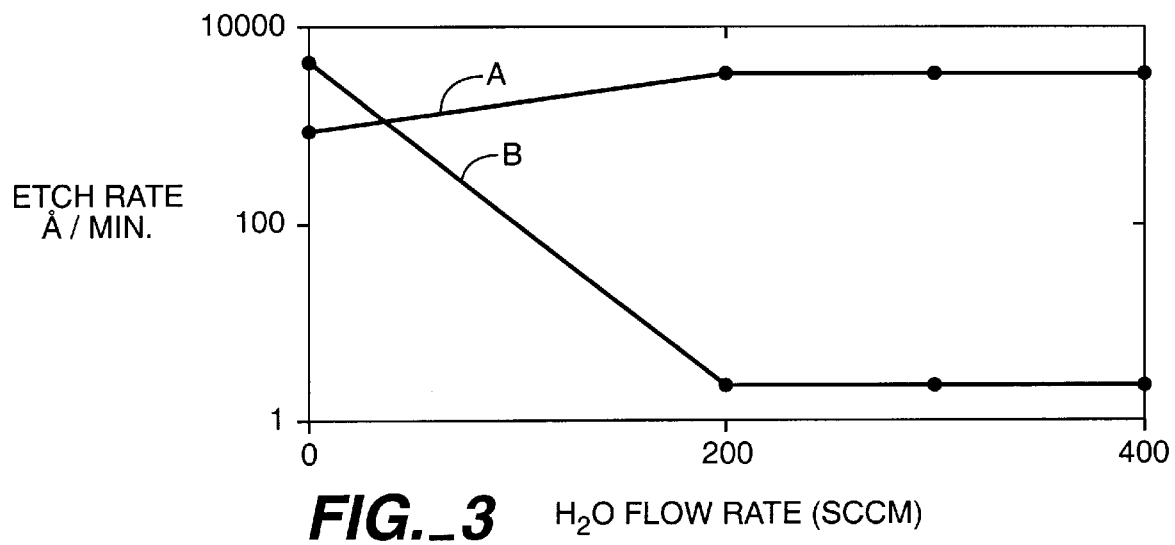
FIG._3
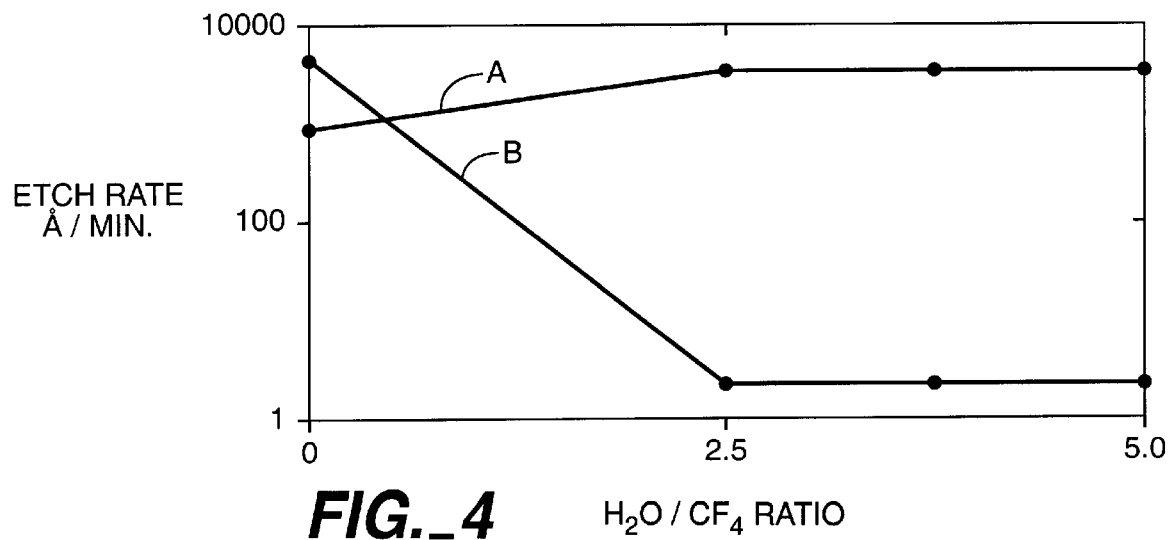
FIG._4

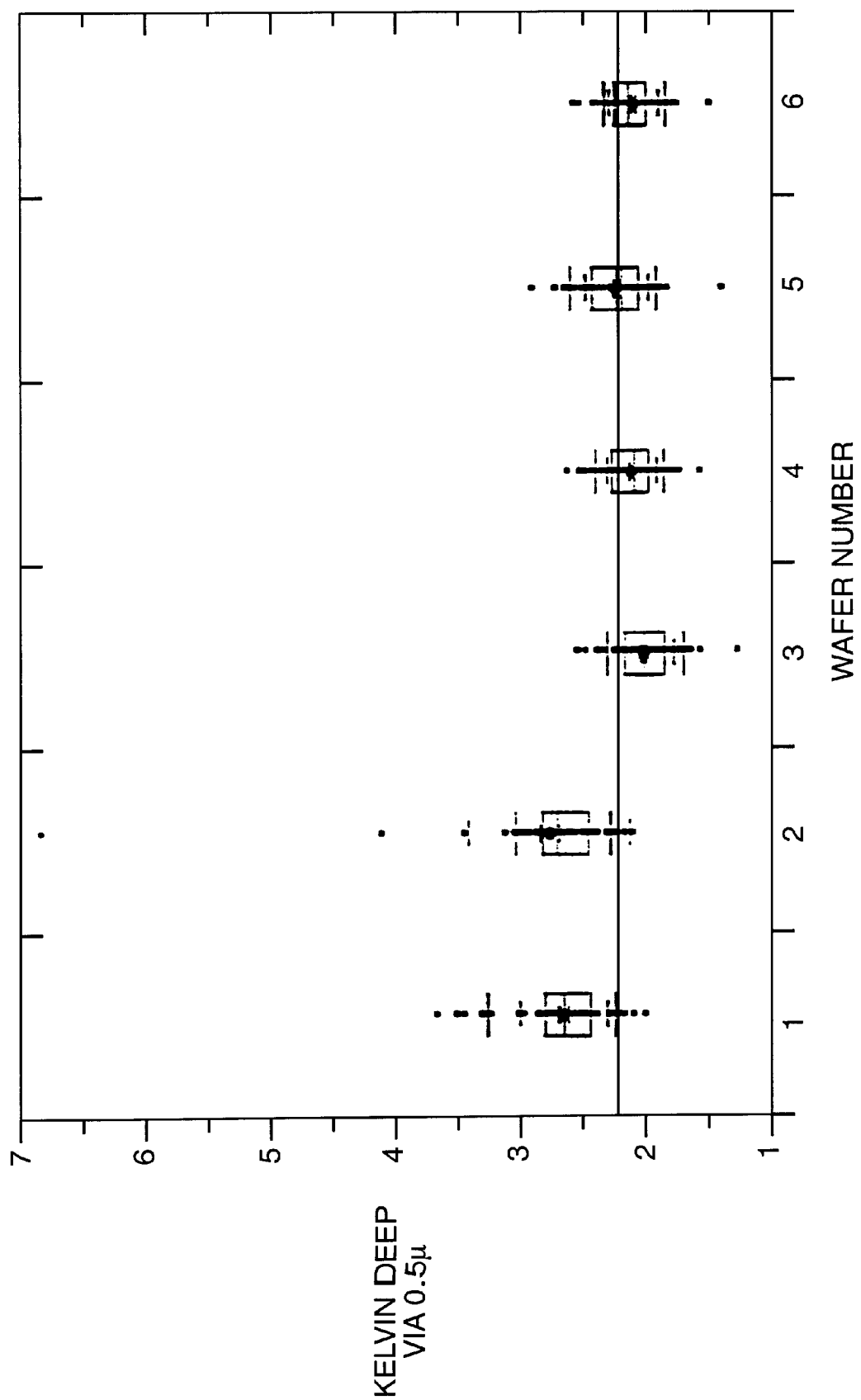
FIG._5

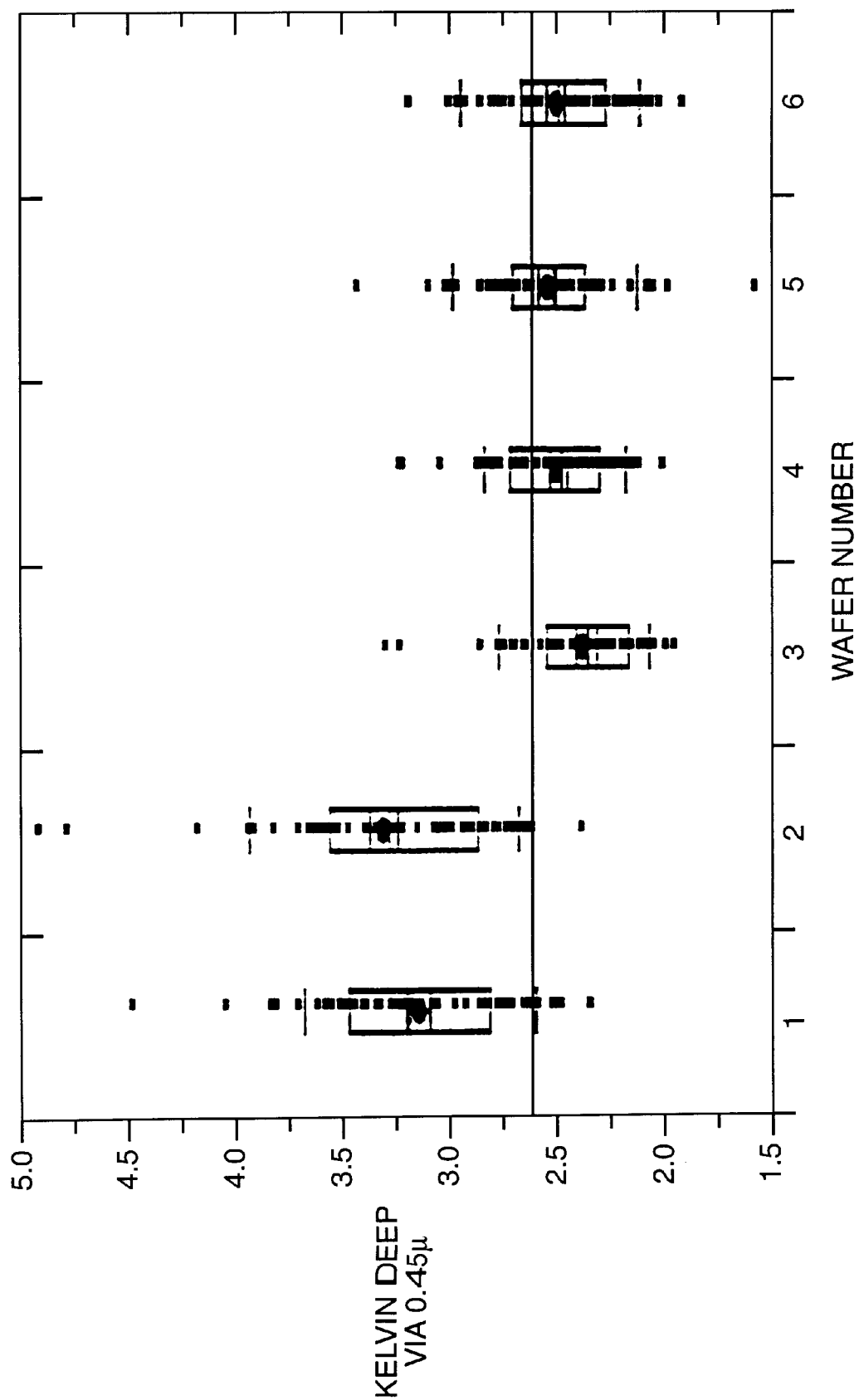
FIG._6

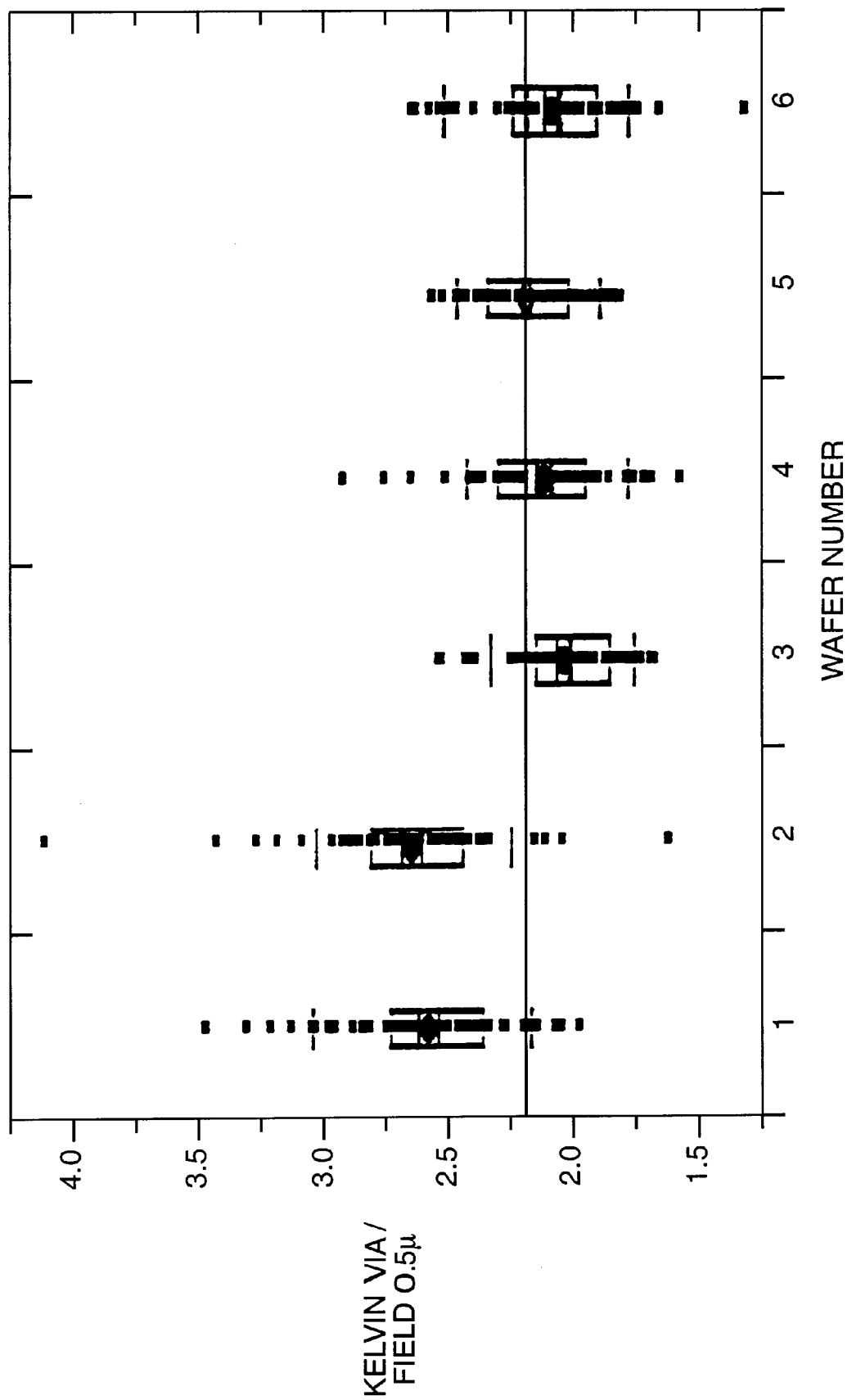
FIG._7

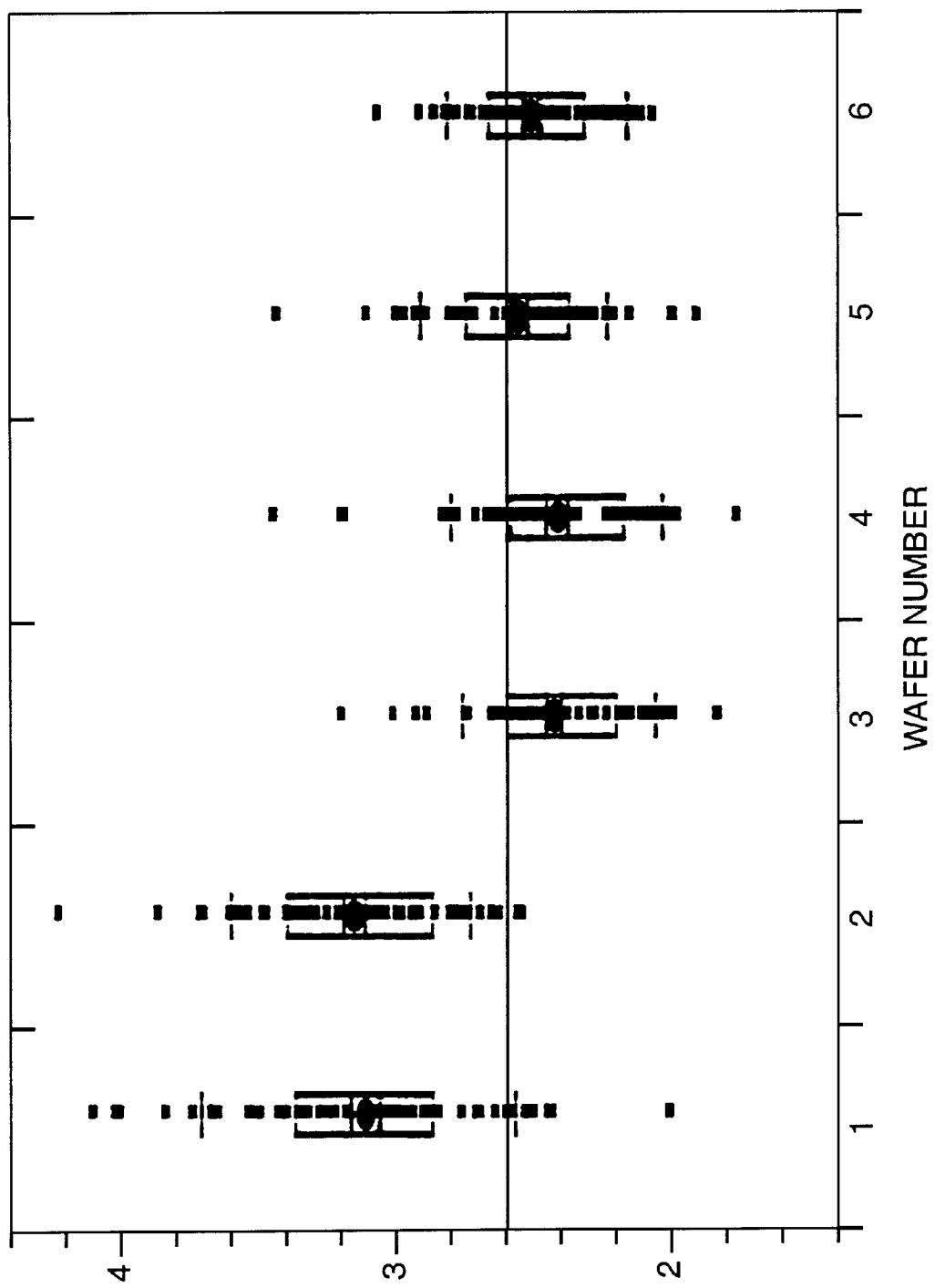
FIG._8

METHOD FOR FORMING VIA CONTACT HOLE IN A SEMICONDUCTOR DEVICE

REFERENCE TO RELATED U.S. APPLICATION

This application is a continuation-in-part of U.S. Ser. No. 08/803,180, filed Feb. 19, 1997, now U.S. Pat. No. 5,851,302.

FIELD OF THE INVENTION

The present invention relates generally to methods of selectively removing sidewall polymers from semiconductor wafers. More particularly, the invention employs plasma etching using an etch gas mixture containing $CF_4$ (or $NF_3$) and $H_2O$ to selectively strip sidewall polymers with negligible metal lift-off to form via contact holes.

BACKGROUND OF THE INVENTION

In semiconductor fabrication, photoresist (or resist) must be removed following a wide variety of processing steps, including etching (wet and dry), ion implantation, lift-off processes, high temperature postbake (for improving resist adhesion or etch resistance), or merely simple removal of misaligned resist patterns for reimaging after development and inspection ("rework"). In addition, wafer surface patterns of several different materials may be present under the resist (e.g. $SiO_2$, aluminum, polysilicon, suicides, deposited $SiO_2$ or $Si_3N_4$ or polyimide). The main objective in resist stripping is to insure that all the photoresist is removed as quickly as possible without attacking any underlying surface materials. Resist stripping techniques are generally divided into three classes: 1) organic strippers; 2) oxidizing-type (inorganic) strippers; and 3) dry type stripping techniques. Dry etching of resist is done using oxygen plasmas in plasma etching equipment. Dry etching offers several advantages over wet resist strippers including safer operating conditions, no metal ion contamination, reduced pollution problems, and less attack of most underlying substrate materials.

The density of devices fabricated on semiconductor substrates has increased steadily over the years with ultra large scale integration. Accompanying this trend have been decreased feature sizes and increased demands on process technology. To pattern such small features, conventional lithographic procedures are being supplanted by newer ones based on diffusion enhanced silylated resist DESIRE™ processes. Diffusion enhanced silylated processes can produce sub-half micron features in various resists, using one line and deep ultra violet light exposure. The resolution and throughput rate up to the image transfer step exceeds that of conventional positive resists and are clearly superior when topography is of major concern.

The resist is somewhat more difficult to remove with diffusion enhanced silylated resist processes as compared with conventional processes as a result of larger amounts of etch byproducts such as sidewall polymer on vertical walls of a device undergoing fabrication. These byproducts, generally referred to as polymers are generally comprised of a metal and $SiO_2$ molecule. For instance, the molecule can comprise carbon from the photoresist, metal from the metal layer and $SiO_2$. Further, sidewall polymers may comprise aluminum silicate and very small amounts of fluorocarbons. Fluorocarbons are non-combustible and therefor are not removed during an $O_2$ in-situ ash sequence of a metal etch. Thus, ashing has proven to be ineffective because of the high carbon content in the byproduct molecule from the photoresist. The difficulty with which resist can be removed has proven to be a sever impediment to the generation of sub-half micron features. Previously solvent/ultrasonic agitation had been used to remove SWP. However, these techniques prove to be unusable because of the tendency of metal, such as aluminum, to lift off of the minimum features. Further, these techniques tend to leave behind significant amounts of residue on device sidewalls and on device surfaces.

One of the major challenges facing state-of-the-art back-end process technologies is the requirement for complete removal of polymers generated during etch of high aspect ratio via holes. The etching processes required to control via sidewall profiles and maintain high selectivity to mask and substrate usually generate polymers which are very difficult to remove. Residual polymers that are not removed will result in vias having higher resistances. These polymers are typically composed of both organic and inorganic components and may required both dry and wet stripping to achieve complete removal. The more difficult the polymer is to remove, the more aggressive must be the solvent stripper, with consequences in safety, cost, and manageability. The burden of strippability can be lessened by making the post-etch ash more effective in creating a soluble polymer, and by increasing the dry etch selectivity to the substrate material.

In view of the deficiencies in conventional methods, the art is in search of improved techniques for removing sidewall polymers and particularly improved methods for forming vias having lower resistances.

SUMMARY OF THE INVENTION

The present invention is based in part on the discovery that dry etching of photoresist and sidewall polymer with an etch gas mixture comprising $CF_4$ or $NF_3$ and $H_2O$ exhibits very aggressive ashrate of photoresist but maintains an exceptionally low etch rate for titanium nitride. The very low TiN etch rate permits the inventive method to effectively breakdown sidewall polymer without removing any significant amount TiN.

In one aspect, the invention is directed to a method of forming a via contact hole in a semiconductor device that includes the steps of:

forming a metal layer on a wafer;

forming a dielectric layer on said metal layer;

forming a photoresist pattern after a photoresist layer is coated on said dielectric layer;

forming a via contact hole by an etching process employing said photoresist pattern as a mask; and removing a layer of sidewall polymer on said via contact hole and a part of said photoresist layer by a process comprising the steps of:

(i) positioning said semiconductor device into a chamber;

(ii) introducing effective amounts of a fluorine containing etchant gas such as $CF_4$ or $NF_3$ and $H_2O$ gas into the chamber;

(iii) decomposing said gases and plasma phase reacting the decomposed gases with the sidewall polymer; and (iv) dissolving the sidewall polymer with a solvent.

Preferably, the relative amounts of $H_2O$ and $CF_4$ (or $NF_3$) introduced into the chamber have a $H_2O$ flow rate to $CF_4$ (or $NF_3$) flow rate ratio of at least about 2.5 to 1. With the inventive process, the ratio of the sidewall polymer etch rate to the metal etch rate is at least 5 to 1. Furthermore, the sidewall polymer is etched at a rate of at least about 5,000 Å per minute.

BRIEF DESCRIPTION OF THE DRAWINGS

FIGS. 1A through 1C are cross-sectional views illustrating the selective removal of photoresist and sidewall polymer from etched metal lines on a semiconductor device;

FIGS. 2A through 2C are cross-sectional views illustrating the selective removal of photoresist and sidewall polymer from etched metal etched via holes on a semiconductor device;

FIG. 3 is a graph of etch rates vs. $H_2O$ flowrate;

FIG. 4 is a graph of etch rates vs. ratio of $H_2O$ to $CF_4$ flow rates; and

FIG. 5, 6, 7, and 8 are graphs of comparative via resistances.

DETAILED DESCRIPTION OF THE PREFERRED EMBODIMENTS

The inventive dry etching process can be implemented with any suitable plasma etching device, specifically any means for creating and sustaining the plasma can be employed. Common techniques to perform plasma-assisted etching include, but are not limited to: (1) glow discharge methods wherein the substrate is directly immersed in the plasma, (2) ion beam methods wherein the plasma is generated in a separate chamber and ions are accelerated towards the surface by means of one or more several grids, (3) beam methods where the plasma is generated in a separate chamber away from the substrate to be etched, but in this case mainly neutral active species and only very few ions are directed onto the substrate surface by means of the combination of differential pressure and/or magnetic fields. See Thin Film Processes II, Vossen and Kern, editors, 1991, Academic Press Inc.

In the dry etch process, reactive species derived from the etchant gases are generated in a plasma and these species diffuse (or are directed) to the resist and/or sidewall polymer. Following adsorption of the species and chemical reactions with the formation of volatile by-products, these by-products are desorbed from the surface and the desorbed species diffuse into the bulk of the gas in the etching chamber. A critical feature is that the etch gas comprises a mixture that has effective amounts of a fluorine containing etchant gas and $H_2O$ as further described herein. The preferred fluorine containing gas is selected from $CF_4$, $NF_3$, and mixtures thereof. The invention will be described using $CF_4$ although it is understood that $NF_3$ can also be employed.

Plasma etching systems typically comprise several components: a) an etching chamber, that is evacuated to reduced pressures; b) a pumping system for establishing and maintaining the reduced pressure; c) pressure gauges to monitor pressure in the chamber; d) a variable conductance between the pump and etching chamber so that the pressure and flow rate in the chamber can be controlled independently; e) an rf power supply to create the glow discharge; f) a gas handling capability to meter and control the flow of reactant gases; and g) electrodes. Detailed assembly of such systems from these components has evolved a variety of configurations, depending upon which parameters of a process need to be controlled, as well as the specific application of the system.

Wafers exposed to energetic ions of a plasma can be subjected to ion-assisted etching processes. Etcher configurations that utilize parallel electrodes can direct energetic ions at the surfaces being etched, by causing them to be accelerated across the potential difference that exists between the plasma and the electrode surfaces. As a result, both a physical and a chemical component can impart directionality to the etch process.

In parallel-electrode systems, the electrodes have a planar, circular shape, and are of approximately the same size. One of the two electrodes of the planar reactor configuration is connected to the rf supply, and the other to ground. Wafers can be placed on either of the electrodes. When wafers are etched in such systems by placing them on the grounded electrode, the system is said to be operated in the plasma etch mode. When wafers are placed directly on the rf-powered electrode, these systems are said to configured in an reactive ion etch mode.

The inventive method can be employed to selectively remove conventional photoresist including, for example, a positive resist such as a novolac-based resist that is spin-coated onto wafers. The method can also selectively remove modified resists such as diffusion enhanced silylated resist which is formed, for instance, by treating conventional positive photoresist with hexamethyldisilazine vapor prior to development. Therefore the term "photoresist or resist" shall include conventional resist and modified resist.

Referring to FIGS. 1A through 1C, there is shown a semiconductor substrate 100 having devices formed therein. The semiconductor substrate has a dielectric layer 102 formed thereon. The dielectric is preferably $SiO_2$ that is deposited by conventional methods, such as, for example, chemical vapor deposition. A first metal layer 104 is formed on the surface of the dielectric layer. It is preferred that the layer 104 comprise TiN or TiW which is formed to a thickness of approximately 500 Å preferably by sputter deposition, however, physical vapor deposition or chemical vapor deposition can also be used.

The second metal layer 110 comprises aluminum or an aluminum alloy, such as AlCu, which is formed to a thickness of approximately 5000 Å. The a third metal layer 112 of metal preferably comprises TiN or TiW and has a thickness of approximately 500 Å that is formed on the second metal layer. Finally, the layer of photoresist material 114 is coated on the third metal layer 112 and is masked and patterned using conventional photoresist techniques to form a pattern that exposes the third metal layer 112 which is etched down to the top surface of the substrate to form a plurality of lines 120 as depicted n FIG. 1B using reactive ion etching.

During the dry etching process which employs an rf field and $Cl_2$, $BCl_3$, $CHF_3$, and $SF_6$ individually or as the components of mixtures of several etchant gases at low pressure, a part of the metal layers, and often the dielectric layer as well, is etched away but a residual polymer 124 on the sidewall of the metal etchline 122 is created. The composition of this polymer layer 124 will vary depending on the etching process and the materials that are etched. As shown in FIG. 1C, following application of the inventive process, the photoresist layer and the residual polymer layer are effectively removed without etching any of the underlying metal layers. The inventive process can effectively remove resist and sidewall polymer from a semiconductor device when both are present and, as is apparent, the process can remove resist or sidewall polymer when only one material is present. As employed herein the term "sidewall polymer" or "polymer" refers to materials that may include resist material. The term "underlying metal" refer to metal, such as, the barrier, bulk conductor, or capping layer, that is in contact with sidewall polymer on a semiconductor device. The underlying metal may be positioned underneath the sidewall polymer or it may be juxtaposed to each other, or both. In any case, the high selectivity of the inventive process permits long exposure of the sidewall polymer to the plasma with negligible adverse effects on the underlying metal.

Substrate 100 includes a semiconductor substrate such as, but not limited to, silicon on which a plurality of active and passive devices can be formed. The dielectric layer is used to electronically isolate the subsequently formed metallization layer used to interconnect the various devices formed in an integrated circuit. Accordingly, a substrate is generally referred to as the material on which layers are formed and on which processes act. The second metal layer 110, the bulk conductor, will make up the main current carrying material of a subsequently formed interconnection. The bulk conductor is preferably aluminum doped with a small amount (0.5%) of copper formed by sputtering, but may also may be other low resistance material such as, but not limited to, copper, silver, and tungsten, and mixtures thereof. The bulk conductor is formed thick enough to provide a suitable low resistance interconnect for the fabricated circuit. First metal layer 104 serves as a barrier layer and is formed over dielectric layer 102 prior to bulk conductor deposition in order to help prevent diffusion of the bulk conductor into the substrate and to provide adhesion to the substrate. The third metal layer 112 serves as a capping layer that is blanket deposited with well known techniques over bulk conductor. Besides TiN, the first and third metal layers can comprise, for example, TiW Ti, and W.

FIGS. 2A through 2C illustrate one application of the inventive method. As depicted in FIG. 2A, there is a semiconductor device substrate 200 having a dielectric layer 202 deposited thereon. A metal line which comprises a first metal layer 204, second metal layer 210, and third metal layer 212 is formed on the dielectric layer. The dielectric and three metal layers may have the same compositions and dimensions as those depicted in FIG. 1A. FIG. 2B shows the semiconductor device following (i) deposition of dielectric layer 240 over the semiconductor substrate, (ii) planarization, (iii) coating the device with photoresist 214 and formation of a mask pattern wherein the metal line is exposed, and (iv) etching via contact hole 230.

In etching processes used for forming the via contact hole, the polymer layer 270 on the sidewall of the photoresist layer and on the sidewall of the via contact hole is formed by the reaction of the photoresist layer, dielectric layer, and metal layers. FIG. 2C depicts the semiconductor device after removal of the sidewall polymer with the inventive process wherein the metal line is not etched.

Resist and sidewall polymer can be effectively removed with the inventive process which employs a mixture of $CF_4$ and $H_2O$ as the etch gas while achieving unexpectedly high selectivity with respect to the underlying metal materials. With the inventive process, it is expected that the selectivity, that is, the ratio of sidewall polymer etch rate to metal etch rate is at least about 5 to 1 and preferably up to about 50 to 1 or higher with respect to metal comprising, for example, Al, Cu, TiN, TiW, Ti, and W mixtures thereof. To achieve the highest selectivity with respect to underlying metal material preferably the ratio of $H_2O$ to $CF_4$ flow rates into the reactive chamber be at least about 2.5 to 1 and preferably up to about 5 to 1, or higher. With the inventive process, It is expected that the sidewall polymer etch rate can reach 5,000 Å/min. and preferably up to about 10,000 or Å/min. or higher.

To demonstrate the high selectivity of the $CF_4$ and $H_2O$ plasma, semiconductor wafers having the structure shown in FIG. 1B, were fabricated. The bulk conductor metal was AlCu and the barrier and capping layers were TiN. The wafers were first subject to metal etching and thereafter subject to resist and sidewall polymer stripping. The metal etcher was a LAM 9600 Transformer Coupled Plasma (TCP)™ reactor and the stripper was a LAM 9600 Decoupled Source Quartz-enclosed) DSQ™ reactor both of which were commercially available from Lam Research Corporation, Fremont, Calif. The DSQ unit is a module that is incorporated to the metal etcher so that wafers that have been metal etched in the TCP main chamber are transferred to the DSQ chamber for resist and sidewall polymer stripping.

Table 1 sets forth the process parameters employed in the metal etcher. The semiconductor wafer having the structure shown in FIG. 1A was held in place with a mechanical clamp that was subjected to helium cooling. The temperature of the clamp was maintained at different temperatures as shown. The power (watts) of the top and bottom electrodes both operating at 13.56 Mhz also varied during the process. Finally, the flow rates of the process gases also changed to coincide with the different stages of the plasma etching process as different materials in the wafer are being etched. At the completion of the metal etching process, the semiconductor device had a plurality of line structures as depicted in FIG. 1B. The device was then subjected to resist and sidewall polymer stripping in the DSQ unit under the process parameters set forth in Table 2. The DSQ unit included a paddle which held the wafer during ashing. Processing occurred when the paddle was in the "up" position. The electrode also operated at 13.56 Mhz.

TABLE 1

| Parameters | Steps | | | | | | | | |
| --- | --- | --- | --- | --- | --- | --- | --- | --- | --- |
|  | 1 | 2 | 3 | 4 | 5 | 6 | 7 | 8 | 9 |
| Press. Mt | 90 | 10 | 10 | 10 | 10 | 10 | 10 | 10 | 90 |
| RF Top W | 0 | 0 | 600 | 0 | 450 | 350 | 0 | 600 | 0 |
| RF Bot W | 0 | 0 | 75 | 0 | 150 | 150 | 0 | 25 | 0 |
| $Cl_2$ sccm | 0 | 0 | 0 | 50 | 50 | 50 | 0 | 0 | 0 |
| $Bcl_3$ sccm | 40 | 40 | 40 | 15 | 15 | 15 | 60 | 60 | 0 |
| $SF_6$ sccm | 40 | 40 | 40 | 0 | 0 | 0 | 45 | 45 | 0 |
| $N_2$ sccm | 10 | 10 | 10 | 0 | 0 | 0 | 12 | 12 | 0 |
| $CHF_3$ sccm | 0 | 0 | 0 | 7 | 7 | 3 | 0 | 0 | 0 |
| He Clamp T | 0 | 3 | 3 | 8 | 8 | 8 | 3 | 3 | 0 |
| Time sec | 10 | 15 | 25 | 20 | 100 | 70 | 20 | 85 | 10 |

TABLE 2

| Parameters | Steps | | | | |
| --- | --- | --- | --- | --- | --- |
|  | 1 | 2 | 3 | 5 | 6 |
| Paddle position | DN | UP | UP | DN | DN (Down) |
| Press. Mt | 1200 | 1200 | 1200 | 0 | 0 |
| RF W | 0 | 0 | 1000 | 0 | 0 |
| $CF_4$ sccm | 0 | 80 | 80 | 0 | 0 |
| $H_2O$ sccm | 500 | 200 | 200 | 0 | 0 |
| Time sec | 5 | 15 | 90 | 3 | 0 |

FIG. 3 is a representative graph of etch rate vs. $H_2O$ flow rate which demonstrates the effect of adding $H_2O$ to etch gas comprising $CF_4$ to the selectivity of the stripping process. Curve A designates the resist/polymer etch rate and curve B designates TiN etch rate. As is apparent, selectivity (resist rate/TiN rate) increases steadily and reaches a maximum when the $H_2O$ flowrate is about 200 sccm FIG. 4 is a graph of etch rate vs. the $H_2O$ to $CF_4$ ratio which shows that maximum selectivity is reached when this ratio is about 2.5. Increasing this ratio (relative to $CF_4$) does not appear to effect the selectivity significantly. It is understood that while an etchant gas mixture $CF_4$ and $H_2O$ is expected to demonstrate high selectivity in dry plasma etching in general, depending on various parameters, including, for instance, the plasma etchant device employed, flow rates of the gases, and material of the underlying metal(s), the maximum selectivity may be achieved at a different $H_2O$ to $CF_4$ ratio. In one embodiment, the etchant gas mixture consists essentially of $CF_4$ and $H_2O$.

Ashing processes using oxygen and fluorine bearing gases have been shown to be more effective in the removal of sidewall polymers generated during dry etch than those comprised only of oxygen. The major problem associated with oxygen/fluorine ashing chemistry is the lack of selectivity, that is, exposure of via sidewall polymer to fluorine-based ash for a sufficient time to render them soluble in subsequent wet strip steps frequently results in the undesirable loss of oxide, TiW, and/or TiN. However, with the present invention it has been demonstrated that the addition of water vapor to an $O_2$ and $CF_4$ ashing process in an inductively coupled plasma decreases the etch rates of oxide, TiW, and TiN relative to photoresist. This 3-gas process ($O_2$, $CF_4$, and $H_2O$) is particularly suited when only oxide and TiW are exposed. The etchrate of TiN relative to photoresist remains relatively too high for this process to be used for any sustained time on that substrate. A 2-gas process composed of $CF_4$ and $H_2O$ was developed which improves the etch rate selectivity of photoresist to TiN even more significantly. The use of this 2-gas ashing process allows for long exposure of the polymer to the fluorinated plasma with no significant adverse effects on the oxide and/or TiN.

To demonstrate the effectiveness of the present invention in fabricating vias having superior characteristics, vias were fabricated using conventional deposition, planarization, photoresist coating, and etching techniques described above. Vias were etched from devices that included: (1) a semiconductor wafer, (2) an $SiO_2$ dielectric layer formed over the wafer, (3) a TiN barrier layer (1000 Å thick), (4) an aluminum bulk conductor layer (5000 Å thick) that was deposited over the barrier layer, and (5) a 1 $\mu$m thick layer of $SiO_2$. Numerous vias (0.35 $\mu$m diameter) were constructed on each semiconductor wafer. For each wafer, following metal etching the wafer was subject to resist and sidewall polymer stripping process that included dry and wet stripping.

The dry stripping employed either comparative ozone or the inventive $CF_4$ and $O_2$ and the wet stripping employed a conventional amine-based (non-hydroxyl amine) organic solvent which is available as ST-26™, from Advanced Chemical Systems International Inc. (Milpitas, Calif.). The ozone dry stripping reactor device was available from Fusion Inc. The inventive technique employed the DSQ™ reactor described above. Scanning electron microscopy of semiconductor wafers, made after the dry stripping and wet stripping steps, showed that the $CF_4$ and $H_2O$ ash process produced vias with clean sidewalls and no visible attack of the TiN. Vias subject to the ozone process contained residual polymer at the base of the via and attack on the TiN. Similar results were shown when the dry gas consisted of $O_2$ and $CF_4$. The presence of the residual polymer remaining in vias will result in considerably higher via resistance.

Use of the present inventive dry stripping technique renders the residual polymers more susceptible for dissolution and removal by the organic solvents. One advantage of this is that less aggressive solvents such as the amine-based (non-hydroxyl amines) that do not etch the metals or oxides can be used. However, it is understood that wet stripping can be accomplished with any suitable solvent for removing residual sidewall polymers.

Following fabrication of the semiconductor wafers, the via resistances were measured using conventional Kelvin deep via resistance techniques wherein the via holes were filled with tungsten followed by deposition of a top metal layer that included a TiN first layer and aluminum second layer. The measured resistance was approximately equal to the cumulative resistances contributed by the top metal layer, titanium metal fill, and the bulk conductor layer. The presence of residual polymers increases the resistance at the titanium/bulk conductor interface.

FIGS. 5 and 6 show Kelvin deep via 0.5 $\mu$m and 0.45 $\mu$m resistance measurements. Similarly, FIGS. 7 and 8 show Kelvin deep via/field 0.5 $\mu$m and 0.45 $\mu$m resistance measurements. For each graph, wafer numbers 1 and 2 denote wafers that were subject to the ozone dry stripping whereas wafer numbers 3–6 denote wafers that were subject to $CF_4$ and $H_2O$. Wafers 3 and 4 were treated for 90 seconds and wafers 5 and 6 for 120 seconds. As is apparent, wafers dry stripped with the $CF_4$ and $H_2O$ ashing processes developed vias having resistances that were significantly lower than those subject to the ozone process.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A method of forming a via contact hole in a semiconductor device that comprises the steps of:

forming a metal layer on a wafer;

forming a dielectric layer on said metal layer;

forming a photoresist pattern after a photoresist layer is coated on said dielectric layer;

forming a via contact hole by an etching process employing said photoresist pattern as a mask; and removing a layer of sidewall polymer on said via contact hole and a part of said photoresist layer by a process comprising the steps of:
   (i) positioning said semiconductor device into a chamber;
   (ii) introducing effective amounts of a fluorine containing etchant gas and $H_2O$ gas into the chamber;
   (iii) decomposing said etchant gas and $H_2O$ gas and plasma phase reacting the decomposed gases with the sidewall polymer; and
   (iv) dissolving the sidewall polymer with a solvent.

2. The method of claim 1 wherein the fluorine containing etchant gas is $CF_4$.

3. The method of claim 2 wherein the ratio of the $H_2O$ flow rate to the $CF_4$ flow rate into the chamber is at least about 2.5 to 1.

4. The method of claim 2 wherein the ratio of the etch rate for sidewall polymer to the etch rate for metal is at least 5 to 1.

5. The method of claim 2 wherein the sidewall polymer is etched at a rate of at least about 5000 Å per minute.

6. The method of claim 1 wherein the metal is material that is selected from the group consisting of TiN, TiW, aluminum, AlCu, and mixtures thereof.

7. The method of claim 2 wherein the metal is material that is selected from the group consisting of TiN, TiW, aluminum, AlCu, and mixtures thereof.

8. The method of claim 1 wherein the metal layer is TiN.

9. The method of claim 2 wherein the metal layer is TiN.

10. The method of claim 1 wherein the dielectric material comprises $SiO_2$.

11. The method of claim 2 wherein the dielectric material comprises $SiO_2$.

* * * * *